United States Patent
Liang et al.

(10) Patent No.: US 10,418,465 B1
(45) Date of Patent: Sep. 17, 2019

(54) NON-VOLATILE MEMORY STRUCTURE IN SILICON-ON-INSULATOR (SOI) TECHNOLOGY

(71) Applicant: QUALCOMM Incorporated, San Diego, CA (US)

(72) Inventors: Qingqing Liang, San Diego, CA (US); Francesco Carobolante, Carlsbad, CA (US); Sinan Goktepeli, San Diego, CA (US); George Imthurn, San Diego, CA (US); Fabio Alessio Marino, San Marcos, CA (US); Narasimhulu Kanike, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/969,986

(22) Filed: May 3, 2018

(51) Int. Cl.
*H01L 29/792* (2006.01)
*H01L 29/66* (2006.01)
*H01L 29/788* (2006.01)
*H01L 27/11556* (2017.01)
*G11C 16/34* (2006.01)
*G11C 16/04* (2006.01)
*H01L 27/105* (2006.01)
*H01L 27/11* (2006.01)
*H01L 29/78* (2006.01)

(52) U.S. Cl.
CPC .... *H01L 29/66825* (2013.01); *G11C 16/0408* (2013.01); *G11C 16/3431* (2013.01); *H01L 27/1052* (2013.01); *H01L 27/11* (2013.01); *H01L 27/1104* (2013.01); *H01L 27/11556* (2013.01); *H01L 29/788* (2013.01); *H01L 29/7841* (2013.01)

(58) Field of Classification Search
CPC .. H01L 27/1052; H01L 27/11; H01L 27/1104; G11C 16/3431
See application file for complete search history.

(56) References Cited

U.S. PATENT DOCUMENTS 9,490,007 B1 * 11/2016 Chan .................... G11C 11/419
2014/0175533 A1   6/2014 Kwon

* cited by examiner

*Primary Examiner* — Ermias T Woldegeorgis
(74) *Attorney, Agent, or Firm* — Patterson & Sheridan, LLP

(57) ABSTRACT

Certain aspects of the present disclosure provide a memory device. One example memory device generally includes a first semiconductor region having a first region, a second region, and a third region, the second region being between the first region and the third region and having a different doping type than the first region and the third region. In certain aspects, the memory device also includes a first non-insulative region, a first insulative region being disposed between the first non-insulative region and the first semiconductor region. In certain aspects, the memory device may include a second non-insulative region, and a second insulative region disposed between the second region and the second non-insulative region, wherein the first insulative region and the second insulative region are disposed adjacent to opposite sides of the second region.

18 Claims, 5 Drawing Sheets

NON-VOLATILE MEMORY STRUCTURE IN SILICON-ON-INSULATOR (SOI) TECHNOLOGY

TECHNICAL FIELD

Certain aspects of the present disclosure generally relate to electronic circuits and, more particularly, to memory devices.

BACKGROUND

Non-volatile memory (NVM) is a type of memory that can store and hold data without a constant source of power. In contrast, data stored in volatile memory may be erased if power to the memory is lost. Flash memory is a type of NVM which may be implemented using an array of metal-oxide semiconductor field-effect transistors (MOSFETs). During a write cycle (e.g., a programming cycle), a threshold voltage of one or more of the MOSFETs is adjusted to store data. During a read cycle, the adjustment of the threshold voltage is sensed to read the data previously stored.

SUMMARY

Certain aspects of the present disclosure generally relate to a structure for a memory device implemented using silicon-on-insulator (SOI) technology.

Certain aspects of the present disclosure provide a memory device. One example memory device generally includes a first semiconductor region having a first region, a second region, and a third region, the second region being between the first region and the third region and having a different doping type than the first region and the third region. In certain aspects, the memory device also includes a first non-insulative region, a first insulative region disposed between the first non-insulative region and the first semiconductor region. In certain aspects, the memory device may include a second non-insulative region, and a second insulative region disposed between the second region and the second non-insulative region, wherein the first insulative region and the second insulative region are disposed adjacent to opposite sides of the second region.

Certain aspects of the present disclosure provide a method for fabricating a memory device. The method generally includes forming a first insulative region; forming a first non-insulative region; forming a first semiconductor region, wherein the first insulative region is formed between the first non-insulative region and the first semiconductor region, the first semiconductor region having a first region, a second region, and a third region, the second region being between the first region and the third region and having a different doping type than the first region and the third region; forming a second insulative region; and forming a second non-insulative region, wherein the second insulative region is disposed between the second region and the second non-insulative region, wherein the first insulative region and the second insulative region are disposed adjacent to opposite sides of the second region.

Certain aspects of the present disclosure provide a method for programming a memory device. The method generally includes applying a voltage to a first non-insulative region, wherein a first insulative region is disposed between the first non-insulative region and a first semiconductor region, the first semiconductor region having a first region, a second region, and a third region, the second region being between the first region and the third region and having a different doping type than the first region and the third region; and applying a reference potential to a second non-insulative region, wherein a second insulative region is disposed between the second region and the second non-insulative region, wherein the first insulative region and the second insulative region are disposed adjacent to opposite sides of the second region, and wherein applying the voltage traps charge between the first insulative region and the second region.

Certain aspects of the present disclosure provide a memory device. One example memory device generally includes a first plurality of non-insulative regions; a second plurality of non-insulative regions, wherein the first plurality of non-insulative regions are perpendicular to the second plurality of non-insulative regions to form a crossbar structure for the memory device; and a plurality of semiconductor regions, wherein each non-insulative region of the first plurality of non-insulative regions is adjacent and parallel to a respective semiconductor region of the plurality of semiconductor regions, wherein the non-insulative region is disposed adjacent to a first side of the respective semiconductor region, and wherein the second plurality of non-insulative regions are disposed adjacent to a second side of the respective semiconductor region, the first side and the second side being opposite sides of the respective semiconductor region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a memory device implemented using silicon-on-insulator (SOI) technology.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Memory Device

Non-volatile memory (NVM) and flash cells are in big demand. Integrating NVM on a standard complementary metal-oxide semiconductor (CMOS) technology may involve the usage of additional masks or process steps, and may often occupy a large area. Certain aspects of the present disclosure provide a NVM structure implemented using silicon-on-insulator (SOI) technology. In certain aspects, bit-lines are implemented using back gates, and word-lines are implemented using front gates, or vice versa, for programming of the NVM as described in more detail herein.

Figure 1A:
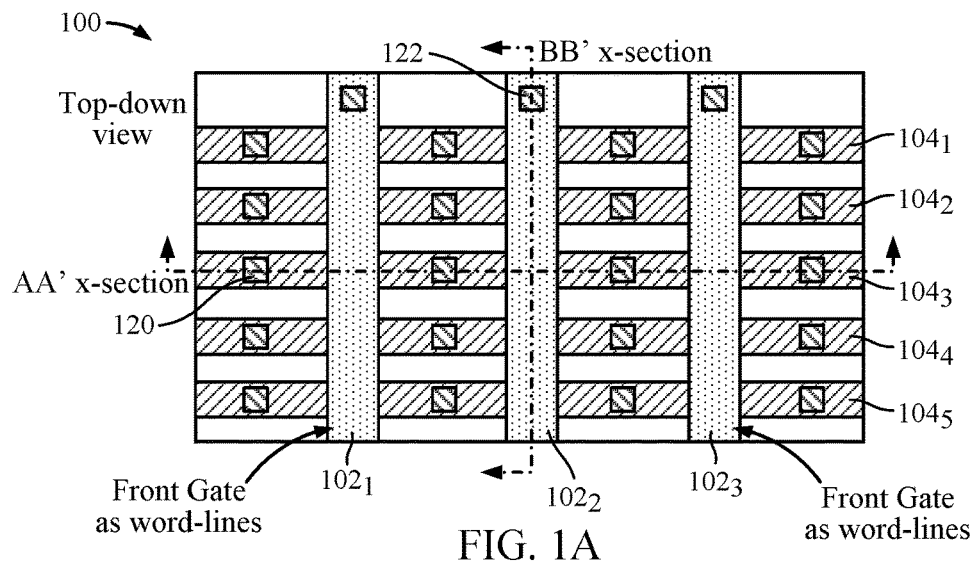
FIGS. 1A, 1B, and 1C illustrate a top-down view and cross-sectional views of an example memory device implemented with back gate bit-lines, in accordance with certain aspects of the present disclosure.
Figure 1B:
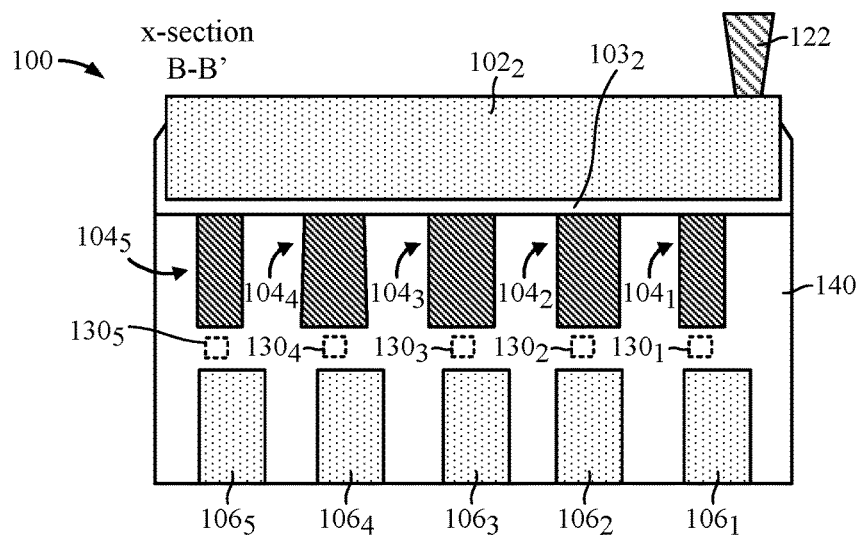
Figure 1C:
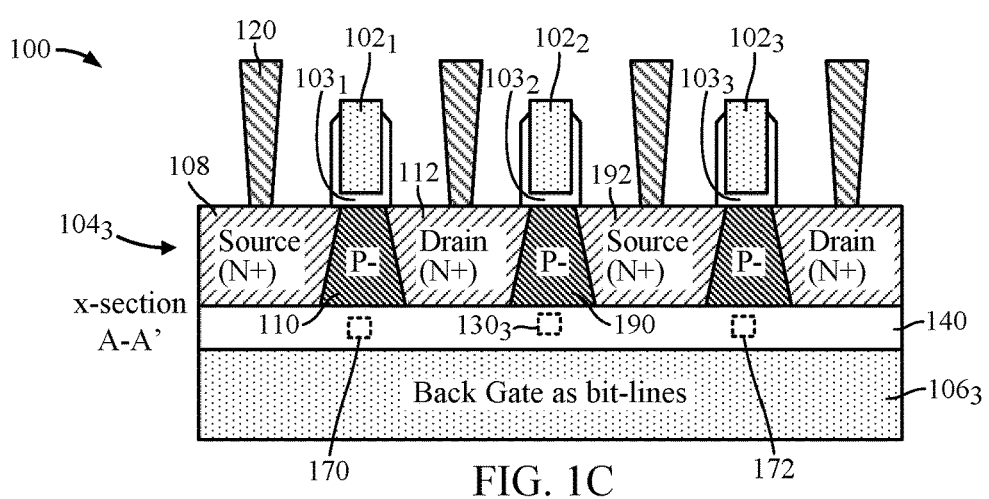

FIGS. 1A, 1B, and 1C illustrate a top-down view and cross-sectional views of an example memory device 100 implemented with back gate bit-lines, in accordance with certain aspects of the present disclosure. FIG. 1C is a cross-section taken through line A-A' in FIG. 1A, and FIG. 1B is a cross-section taken through line B-B' in FIG. 1A. As illustrated, the memory device 100 includes multiple front gate regions used as word-lines. For example, the memory device 100 includes non-insulative regions $102_1$, $102_2$, and $102_3$ (collectively referred to as "non-insulative regions 102"). Each of the non-insulative regions 102 is separated from a semiconductor region $104_3$ by a respective one of insulative regions $103_1$, $103_2$, and $103_3$, as illustrated. As used herein, a non-insulative region generally refers to a region that may be conductive or semiconductive. While the example memory device 100 illustrates three word-lines to facilitate understanding, the memory device 100 may be implemented with any number of word-lines.

In certain aspects, each of the non-insulative regions 102 spans over multiple semiconductor regions $104_1$, $104_2$, $104_3$, $104_4$, and $104_5$ (collectively referred to as "semiconductor regions 104"), as illustrated in FIG. 1A. While the example memory device 100 illustrates five bit-lines to facilitate understanding, the memory device 100 may be implemented with any number of bit-lines. Each of the semiconductor regions 104 includes multiple regions. For example, as illustrated in FIG. 1C, the semiconductor region $104_3$ may include a region 108 (e.g., a source region), a region 110, a region 112 (e.g., a drain region), a region 190, and a region 192 (e.g., a source region). The region 110 has a different doping type (e.g., P−) than the doping type (e.g., N+) of the regions 108 and 112, forming a metal-oxide semiconductor field-effect transistor (MOSFET). Moreover, region 190 has a different doping type than the doping of the regions 112 and 192, forming another MOSFET. As illustrated, the non-insulative region $102_1$ is disposed over the region 110.

Each of the semiconductor regions 104 is disposed over a separate one of the back gate regions. For example, the semiconductor regions $104_1$, $104_2$, $104_3$, $104_4$, and $104_5$ are disposed over non-insulative regions $106_1$, $106_2$, $106_3$, $106_4$, and $106_5$ (collectively referred to as "non-insulative regions 106"), respectively, which are used as bit-lines for the memory device 100. Thus, the non-insulative regions 102 (e.g., word-lines) and the non-insulative regions 106 (e.g., bit-lines) form a memory array (e.g., a crossbar type array), allowing the memory device 100 to be implemented in a compact manner. Moreover, each of the different regions of the semiconductor regions 104 is coupled to a contact terminal, and each of the non-insulative regions 102 is coupled to a contact terminal. For example, the region 108 is coupled to a contact terminal 120, and the non-insulative region $102_2$ is coupled to a contact terminal 122.

In certain aspects, non-insulative regions $130_1$, $130_2$, $130_3$, $130_4$, and $130_5$ (collectively referred to as "non-insulative regions 130") may be disposed between each of the non-insulative regions 106 and a respective one of the semiconductor regions 104, as illustrated in FIG. 1B. The non-insulative regions 130 may also be referred to as floating gates and may serve to trap charge between the non-insulative regions 106 and the semiconductor regions 104. As will be described in more detail herein, charge may be trapped between the semiconductor regions 104 and the non-insulative regions 106 during programming of the memory device 100, adjusting the threshold voltage of a respective MOSFET of the memory device 100. By including the floating gates, the threshold voltage of the MOSFET may be adjusted by a greater amount as compared to a memory device implemented without the floating gates. As illustrated in FIG. 1C, non-insulative regions 170, $130_3$, and 172 (e.g., floating gates) are disposed between the semiconductor region $104_3$ and the non-insulative region $106_3$. The memory device 100 may also be implemented without floating gates. In this case, the charge may be trapped in an interface between the semiconductor regions 104 (e.g., region 110) and an insulative region 140, as described in more detail with respect to FIG. 3. The insulative region 140 may be disposed between and surround portions of the semiconductor regions 104 and the non-insulative regions 106. The insulative region 140 may comprise a dielectric material, for example.

Figure 2A:
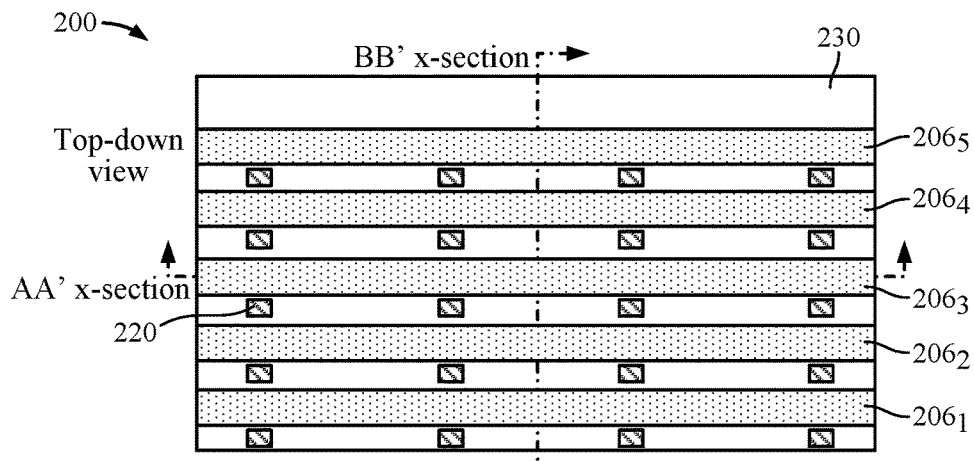
FIGS. 2A, 2B, and 2C illustrate a top-down view and cross-sectional views of an example memory device implemented with back gate word-lines, in accordance with certain aspects of the present disclosure.
Figure 2B:
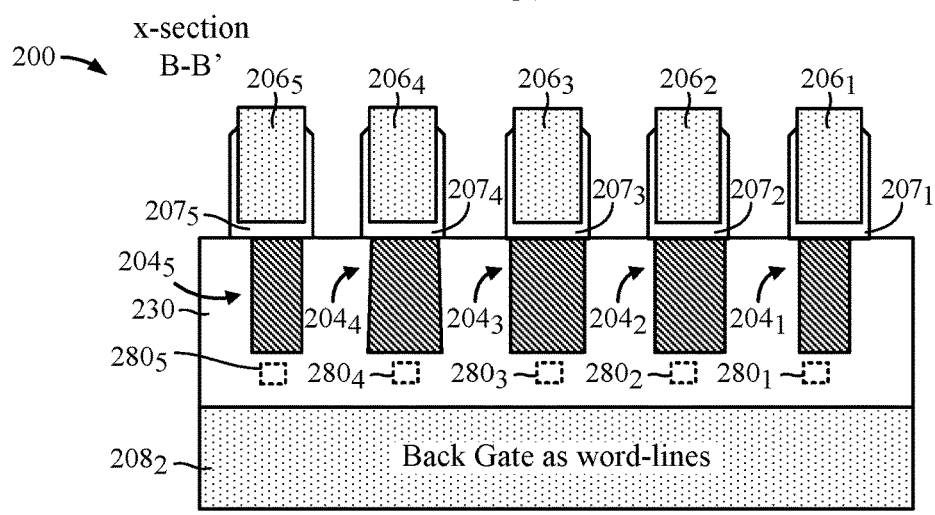
Figure 2C:
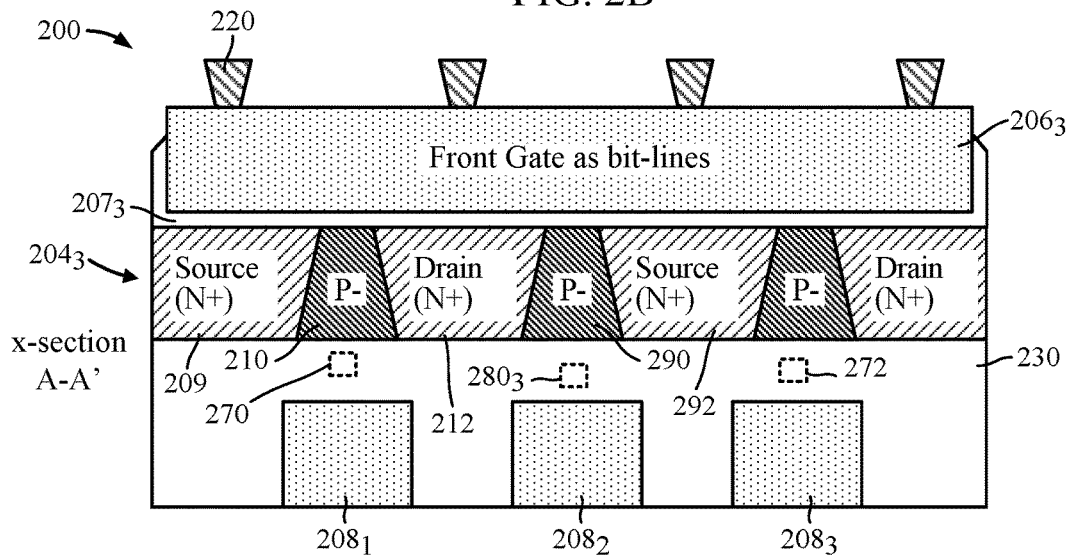

FIGS. 2A, 2B, and 2C illustrate a top-down view and cross-sectional views of an example memory device 200 implemented with a back gate word-line, in accordance with certain aspects of the present disclosure. FIG. 2C is a cross-section taken through line A-A' in FIG. 2A, and FIG. 2B is a cross-section taken through line B-B' in FIG. 2A. As illustrated, the memory device 200 includes multiple front gate regions used as bit-lines. For example, the memory device 200 includes non-insulative regions $206_1$, $206_2$, $206_3$, $206_4$, and $206_5$ (collectively referred to as "non-insulative regions 206"). While the example memory device 200 illustrates five bit-lines to facilitate understanding, the memory device 200 may be implemented with any number of bit-lines. Each of the non-insulative regions 206 is disposed over a respective one of insulative regions $207_1$, $207_2$, $207_3$, $207_4$, and $207_5$ and multiple semiconductor regions $204_1$, $204_2$, $204_3$, $204_4$, and $204_5$ (collectively referred to as "semiconductor regions 204"). Each of the semiconductor regions 204 includes multiple regions. For example, as illustrated in FIG. 1C, the semiconductor region $204_3$ may include a region 209 (e.g., a source region), a region 210, a region 212 (e.g., a drain region), a region 290, and a region 292 (e.g., a source region). The region 210 has a different doping type (e.g., P−) than the doping type (e.g., N+) of the region 209 and the region 212. Moreover, the region 290 has a different doping type than the doping type of the region 212 and the region 292.

The memory device 200 also includes multiple back gate regions. For example, the memory device 200 includes non-insulative regions $208_1$, $208_2$, and $208_3$ (collectively referred to as "non-insulative regions 208"), respectively, which are used as word-lines for the memory device 200. While the example memory device 200 illustrates three word-lines to facilitate understanding, the memory device 200 may be implemented with any number of word-lines. The non-insulative regions 208 are disposed adjacent to an insulative region 230 (e.g., a buried oxide (BOX) region) of the memory device 200, portions of which are disposed between non-insulative regions 208 and the semiconductor regions 204 for electric isolation. Moreover, the source and drain regions of each of the semiconductor regions 204 are coupled to respective contact terminals, as illustrated in FIGS. 2A and 2C. For example, the region 209 is coupled to a contact terminal 220. In certain aspects, each of non-insulative regions $280_1$, $280_2$, $280_3$, $280_4$, and $280_5$ (e.g., floating gates) may be disposed between a respective one of the semiconductor regions 204 and the non-insulative region $208_2$, as illustrated in FIG. 2B. As illustrated in FIG. 2C, non-insulative regions 270, $280_3$, and 272 (e.g., floating gates) are disposed between the semiconductor region $204_3$ and a respective one of the non-insulative regions 208.

In certain aspects, the back gate region and/or the front gate regions as described herein may be implemented using metal or polycrystalline silicon.

Figure 3:
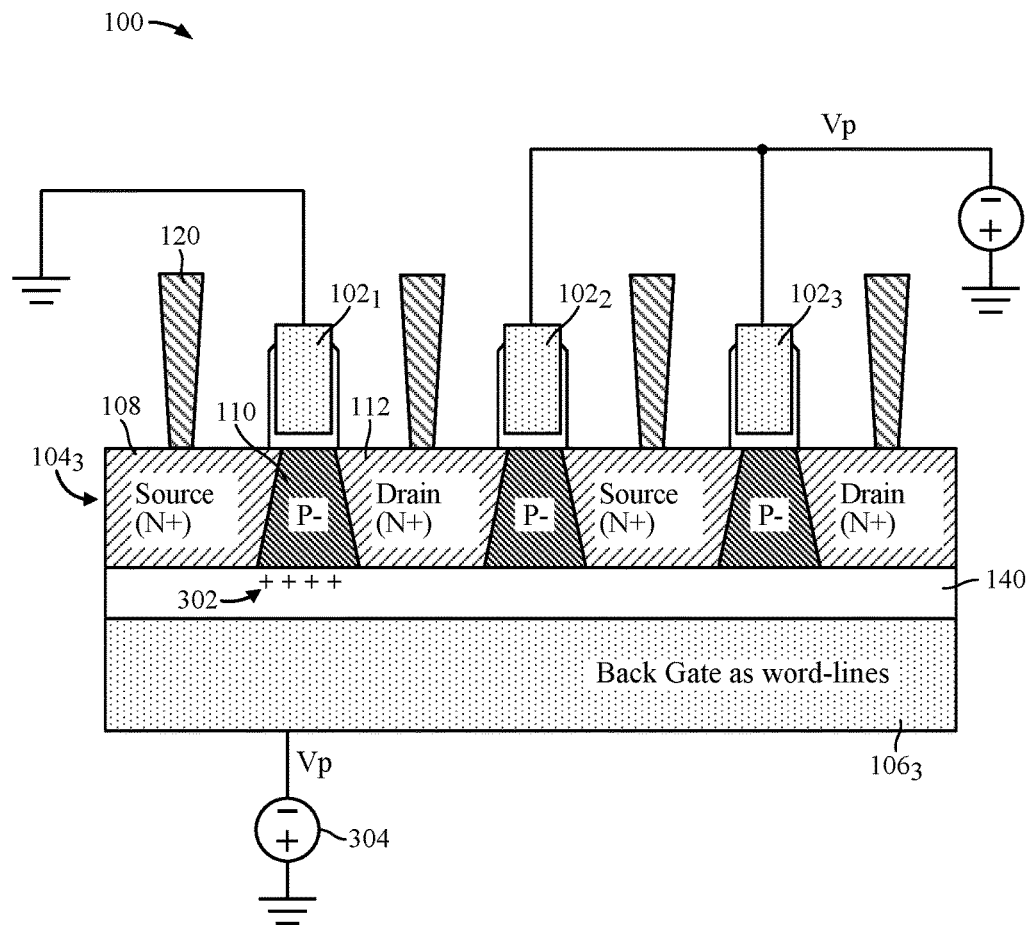
FIG. 3 illustrates an example system for programming the memory device, in accordance with certain aspects of the present disclosure.

FIG. 3 illustrates an example system for programming the memory device 100, in accordance with certain aspects of the present disclosure. In certain aspects, a programming circuit may be implemented to program (e.g., write data to) the memory device 100. For example, the circuit may couple one of the word-lines (e.g., the non-insulative region $102_1$) to a reference potential (e.g., electric ground) and one of the bit-lines (e.g., the non-insulative region $106_3$) to a voltage source 304, as illustrated, in order to apply a voltage potential Vp between the non-insulative region $102_1$ and the non-insulative region $106_3$. By applying the voltage potential Vp, charge 302 is trapped in the interface between the region 110 and the insulative region 140, shifting the threshold voltage of the MOSFET having regions 108, 110, and 112, effectively storing a logic high for the memory cell defined by the intersection between the non-insulative region $102_1$ (word-line) and the non-insulative region $106_3$ (bit-line). Moreover, the same voltage potential Vp applied to the non-insulative region $106_3$ may also be applied to other word-lines (e.g., non-insulative regions $102_2$ and $102_3$) such that the memory cells defined by the intersection of the non-insulative region $106_3$ (bit-line) and the non-insulative regions $102_2$ and $102_3$ are set to logic low.

Figure 4:
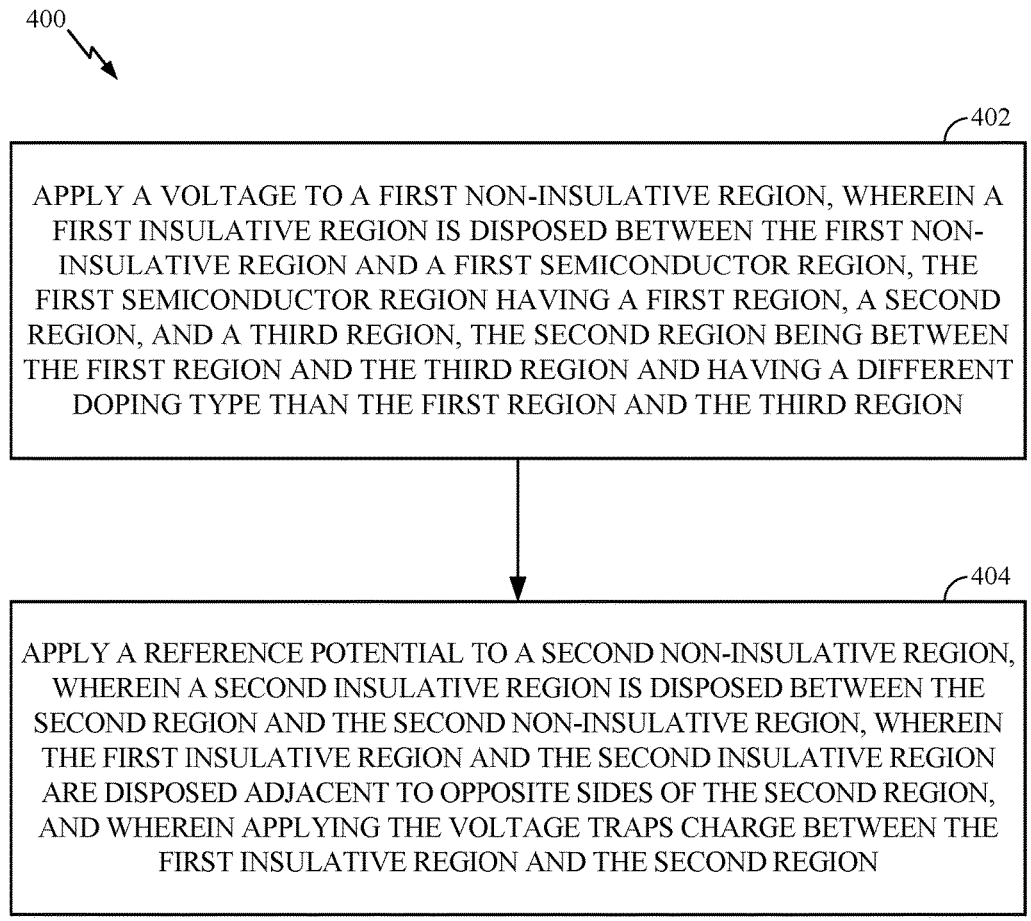
FIG. 4 is a flow diagram of example operations for programming a memory device, in accordance with certain aspects of the present disclosure.

FIG. 4 is a flow diagram of example operations 400 for programming a memory device, in accordance with certain aspects of the present disclosure. The operations 400 may be performed, for example, by a programming circuit.

Operations 400 may begin, at block 402, by applying a voltage (e.g., voltage potential Vp) to a first non-insulative region (e.g., the non-insulative region $106_3$). In certain aspects, a first insulative region (e.g., insulative region 140) is disposed between the first non-insulative region and a first semiconductor region (e.g., semiconductor region $104_3$), the first semiconductor region having a first region (e.g., region 108), a second region (e.g., region 110), and a third region (e.g., region 112). In certain aspects, the second region is between the first region and the third region and has a different doping type than the first region and the third region. At block 404, a reference potential is applied to a second non-insulative region (e.g., non-insulative region $102_1$). In certain aspects, a second insulative region (e.g., insulative region $103_1$) is disposed between the second region and the second non-insulative region. The first insulative region and the second insulative region may be disposed adjacent to opposite sides of the second region. In certain aspects, applying the voltage traps charge between the first insulative region and the second region.

In certain aspects, the operations 400 also include applying the voltage (e.g., Vp) to a third non-insulative region (e.g., non-insulative region $102_2$). In certain aspects, a third insulative region (e.g., insulative region $103_2$) is disposed between the first semiconductor region and the third non-insulative region. In certain aspects, the first semiconductor region comprises a fourth region and fifth region, the fourth region being between the third region and the fifth region and having a different doping type than the third region and the fifth region.

In certain aspects, the charge is trapped in a floating gate surrounded by the first insulative region and disposed between the first non-insulative region and second region. In certain aspects, the charge is trapped in an interface between the second region and the first insulative region.

Figure 5:
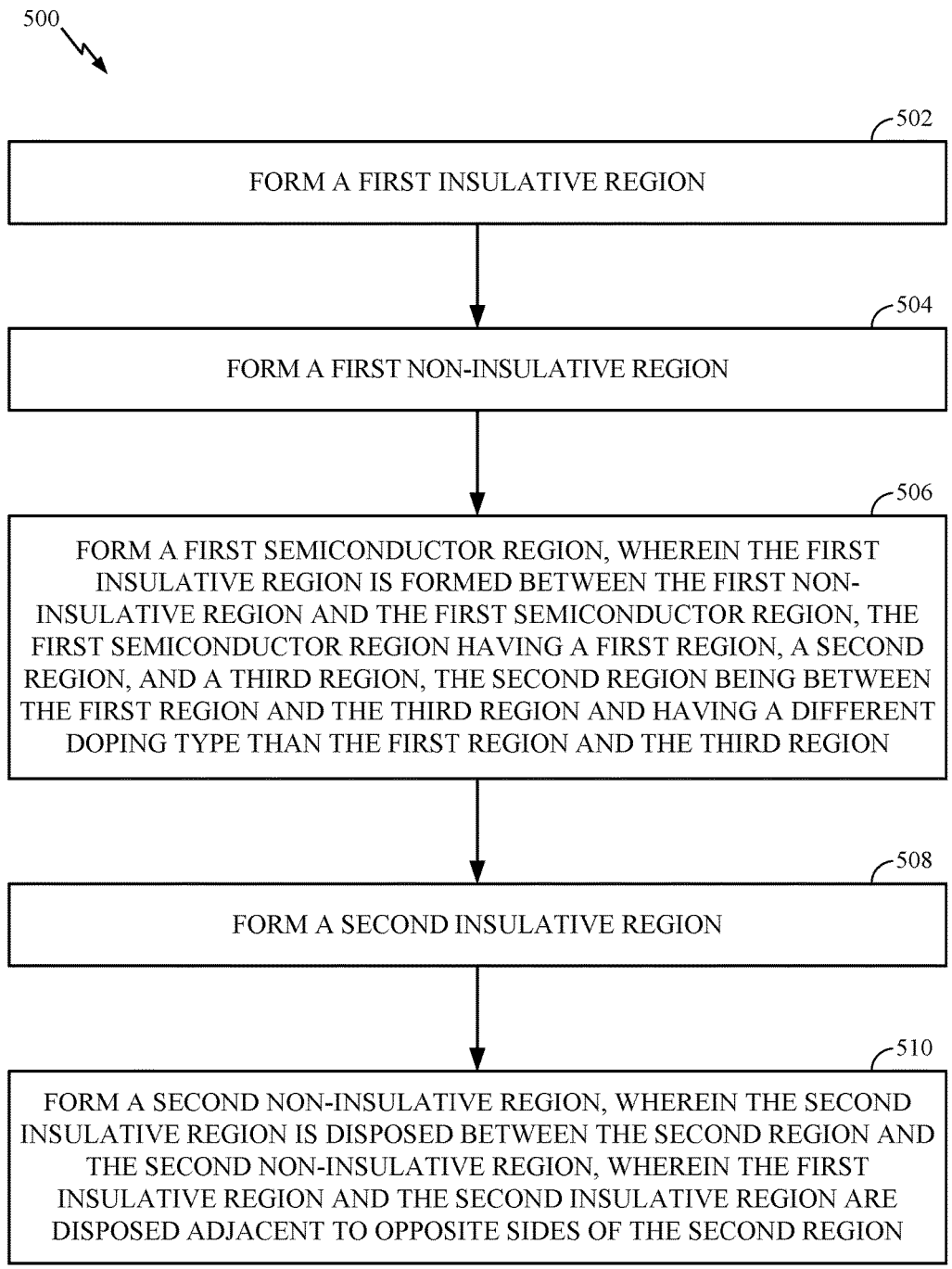
FIG. 5 is a flow diagram of example operations for fabricating a memory device, in accordance with certain aspects of the present disclosure.

FIG. 5 is a flow diagram of example operations 500 for fabricating a memory device, in accordance with certain aspects of the present disclosure. The operations 500 may be performed, for example, by a semiconductor processing chamber.

Operations 500 may begin, at block 502, by forming a first insulative region (e.g., insulative region 140 or insulative region $207_3$), and at block 504, by forming a first non-insulative region (e.g., non-insulative region $106_3$ or non-insulative region $206_3$). At block 506, a first semiconductor region (e.g., semiconductor region $104_3$ or semiconductor region $204_3$) is formed. In certain aspects, the first insulative region is formed between the first non-insulative region and the first semiconductor region, the first semiconductor region having a first region (e.g., region 108 or region 209), a second region (e.g., region 110 or region 210), and a third region (e.g., region 112 or region 212). In certain aspects, the second region is between the first region and the third region and has a different doping type than the first region and the third region. At block 508, a second insulative region (e.g., insulative region $103_1$ or portion of the insulative region 230 disposed between the region 210 and the non-insulative region $208_1$) is formed, and at block 510, a second non-insulative region (e.g., non-insulative region $102_1$ or non-insulative region $208_1$) is formed. In certain aspects, the second insulative region is disposed between the second region and the second non-insulative region, wherein the first insulative region and the second insulative region are disposed adjacent to opposite sides of the second region.

In certain aspects, the first semiconductor region comprises a fourth region (e.g., region 190 or region 290) and fifth region (e.g., region 192 or region 292), the fourth region being between the third region and the fifth region and having a different doping type than the third region and the fifth region. In this case, the operations 500 also include forming a third insulative region (e.g., insulative region $103_2$ or portion of insulative region 230 disposed between the region 290 and the non-insulative region $208_2$), and forming a third non-insulative region (e.g., non-insulative region $102_2$ or non-insulative region $208_2$), wherein the third insulative region is formed between the fourth region and the third non-insulative region. In certain aspects, the first insulative region and the third insulative region are disposed adjacent to opposite sides of the fourth region.

In certain aspects, the first non-insulative region comprises a bit-line of the memory device, and the second non-insulative region comprises a word-line of the memory device. In certain aspects, the operations 500 also include forming a second semiconductor region (e.g., semiconductor region $104_2$ or semiconductor region $204_2$) having a fourth region, a fifth region, and a sixth region (e.g., analogous to regions 108 (or 209), 110 (or 210), and 112 (or 212), but on a different semiconductor region, such as semiconductor region $104_2$ or $204_2$). In this case, the fifth region may be between the fourth region and the sixth region and may have a different doping type than the fourth region and the sixth region. In this case, the operations 500 also include forming a third non-insulative region (e.g., non-insulative region $106_2$ or non-insulative region $206_2$), wherein a third insulative region (e.g., insulative region $207_2$) is formed between the third non-insulative region and the second semiconductor region. In certain aspects, the second insulative region and the third insulative region are formed adjacent to opposite sides of the fifth region of the second semiconductor region. In certain aspects, the operations 500 also include forming a floating gate region (e.g., non-insulative region 170) such that the floating gate region is surrounded by the first insulative region (e.g., insulative region 140) and is between the first non-insulative region (e.g., non-insulative region $106_3$) and the second region (e.g., region 110). In other aspects, the operations 500 may include forming a floating gate region (e.g., non-insulative region 270) such that the floating gate region is surrounded by the second insulative region (e.g., insulative region 230) and is between the second non-insulative region (e.g., non-insulative region $208_1$) and the second region (e.g., region 210).

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A memory device comprising:
a first semiconductor region having a first region, a second region, and a third region, the second region being between the first region and the third region and having a different doping type than the first region and the third region;
a first non-insulative region, the first non-insulative region comprising a bit-line of the memory device;
a first insulative region disposed between the first non-insulative region and the first semiconductor region;
a second non-insulative region, the second non-insulative region comprising a word-line of the memory device; and
a second insulative region disposed between the second region and the second non-insulative region, wherein the first insulative region and the second insulative region are disposed adjacent to opposite sides of the second region.

2. The memory device of claim 1, wherein the first semiconductor region comprises a fourth region and a fifth region, the fourth region being between the third region and the fifth region and having a different doping type than the third region and the fifth region, and wherein the memory device further comprises:
a third non-insulative region; and
a third insulative region disposed between the fourth region and the third non-insulative region.

3. The memory device of claim 2, wherein the first insulative region and the third insulative region are disposed adjacent to opposite sides of the fourth region.

4. The memory device of claim 1, further comprising:
a second semiconductor region having a fourth region, a fifth region, and a sixth region, the fifth region being between the fourth region and the sixth region and having a different doping type than the fourth region and the sixth region;
a third non-insulative region; and
a third insulative region disposed between the third non-insulative region and the second semiconductor region.

5. The memory device of claim 4, wherein the second insulative region and the third insulative region are disposed adjacent to opposite sides of the fifth region of the second semiconductor region.

6. The memory device of claim 1, further comprising a contact coupled to each of the first region, the third region, and the second non-insulative region.

7. The memory device of claim 1, wherein the first semiconductor region is disposed above the first non-insulative region and wherein the second non-insulative region is disposed above the first semiconductor region.

8. The memory device of claim 1, further comprising a floating gate region surrounded by the first insulative region and disposed between the first non-insulative region and the second region.

9. A memory device comprising:
a first plurality of non-insulative regions;
a second plurality of non-insulative regions, wherein the first plurality of non-insulative regions are perpendicular to the second plurality of non-insulative regions to form a crossbar structure for the memory device; and
a plurality of semiconductor regions, wherein each non-insulative region of the first plurality of non-insulative regions is adjacent and parallel to a respective semiconductor region of the plurality of semiconductor regions, wherein each non-insulative region of the first plurality of non-insulative regions is disposed adjacent to a first side of the respective semiconductor region, and wherein each non-insulative region of the second plurality of non-insulative regions is disposed adjacent to a second side of the respective semiconductor region, the first side and the second side being opposite sides of the respective semiconductor region.

10. The memory device of claim 9, wherein each of the plurality of semiconductor regions comprises a first region, a second region, and a third region, the second region being between the first region and the third region and having a different doping type than the first region and the third region.

11. The memory device of claim 10, wherein one of the second plurality of non-insulative regions is disposed adjacent to the second region of each of the plurality of semiconductor regions.

12. The memory device of claim 9, wherein the first plurality of non-insulative regions are configured as bit-lines for the memory device, and the second plurality of non-insulative regions are configured as word-lines for the memory device.

13. A method for fabricating a memory device, comprising:
    forming a first insulative region;
    forming a first non-insulative region, the first non-insulative region comprising a bit-line of the memory device;
    forming a first semiconductor region, wherein the first insulative region is disposed between the first non-insulative region and the first semiconductor region, the first semiconductor region having a first region, a second region, and a third region, the second region being between the first region and the third region and having a different doping type than the first region and the third region;
    forming a second non-insulative region, the second non-insulative region comprising a word-line of the memory device; and
    forming a second insulative region, wherein the second insulative region is disposed between the second region and the second non-insulative region, and wherein the first insulative region and the second insulative region are disposed adjacent to opposite sides of the second region.

14. The method of claim 13, wherein the first semiconductor region comprises a fourth region and a fifth region, the fourth region being between the third region and the fifth region and having a different doping type than the third region and the fifth region, the method further comprising:
    forming a third insulative region; and
    forming a third non-insulative region, wherein the third insulative region is disposed between the fourth region and the third non-insulative region.

15. The method of claim 14, wherein the first insulative region and the third insulative region are disposed adjacent to opposite sides of the fourth region.

16. The method of claim 13, further comprising:
    forming a second semiconductor region having a fourth region, a fifth region, and a sixth region, the fifth region being between the fourth region and the sixth region and having a different doping type than the fourth region and the sixth region;
    forming a third insulative region; and
    forming a third non-insulative region, wherein the third insulative region is disposed between the third non-insulative region and the second semiconductor region.

17. The method of claim 16, wherein the second insulative region and the third insulative region are disposed adjacent to opposite sides of the fifth region of the second semiconductor region.

18. The method of claim 13, further comprising:
    forming a floating gate region such that the floating gate region is surrounded by the first insulative region and is between the first non-insulative region and the second region.

\* \* \* \* \*